(12) United States Patent
Yamashita et al.

(10) Patent No.: US 6,756,607 B2
(45) Date of Patent: Jun. 29, 2004

(54) METHOD AND DEVICE FOR DETERMINING BACKGATE CHARACTERISTICS

(75) Inventors: Masashi Yamashita, Itami (JP); Mitsutaka Tsubokura, Itami (JP); Makoto Kiyama, Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 10/249,710

(22) Filed: May 1, 2003

(65) Prior Publication Data

US 2004/0000692 A1 Jan. 1, 2004

(30) Foreign Application Priority Data

Jun. 27, 2002 (JP) ........................................ 2002-188413

(51) Int. Cl.[7] .............................................. H01L 23/58
(52) U.S. Cl. .................................. 257/48; 257/E21.521
(58) Field of Search ............................. 257/48, E21.521

(56) References Cited

U.S. PATENT DOCUMENTS 6,368,938 B1 * 4/2002 Usenko ...................... 438/407
6,535,015 B1 * 3/2003 Krishnan et al. ........... 324/769

FOREIGN PATENT DOCUMENTS

| JP | S49-103570 | 10/1974 |
| JP | S52-24830 | 7/1977 |
| JP | S53-42662 | 11/1978 |
| JP | H06-077425 A | 3/1994 |
| JP | H09-205123 | 8/1997 |
| JP | H09-266237 | 10/1997 |
| JP | H11-186350 | 7/1999 |

* cited by examiner

*Primary Examiner*—David Nelms
*Assistant Examiner*—Tu-Tu Ho
(74) *Attorney, Agent, or Firm*—James Judge

(57) ABSTRACT

Backgate-characteristics determination method and device that make for curtailing the fabrication of semiconductor circuit elements having defective backgate-characteristics. Initially a first C-V curve 30 representing the relation between a voltage applied to the obverse face of a wafer 20 serving as a substrate for semiconductor circuit elements, and its capacitance, is found. Next, a second C-V curve 32 is found through applying a voltage to the reverse face of the wafer 20. The backgate characteristics for the semiconductor circuit elements are determined based on a voltage-shift amount 34 for the wafer 20, found from the first C-V curve 30 and the second C-V curve 32.

31 Claims, 4 Drawing Sheets

(a) HEMT Epitaxial wafer (b) HEMT Test epitaxial wafer

METHOD AND DEVICE FOR DETERMINING BACKGATE CHARACTERISTICS

BACKGROUND OF INVENTION

1. Field of the Invention

The present invention relates to a method and device for determining the acceptability of backgate-effect characteristics in semiconductor elements fabricated with wafers as a base.

2. Description of the Background Art

FETs (field-effect transistors) and HEMTs (high-electron mobility transistors) are capable of high-speed switching, and RF Amplifying, and therefore are currently being put to use in a variety of devices such as mobile-phone amplifiers and switches. High operability is consequently demanded of FETs and HEMTs as working devices, and backgate-effect characteristics are measured as one indicator of the precision of the components.

Mention of the backgating effect is made in Japanese Pub. Pat. H06-077425. Applying a negative voltage to the wafer reverse face, on the opposite side of the wafer surface that is formed with FETS, captures at a deep level electrons implanted through the wafer reverse face into the substrate, and due to the captured electrons, elevates the electrostatic potential of the wafer reverse-face side. The result in a situation in which the substrate is furnished with n-channel FETs is that the depletion layer extends out from its side at the reverse face of the wafer to the channel side of the n-channel FET, narrowing the channel and leading to reduction in the drain current. This phenomenon is called the backgate effect; semiconductor circuit elements in which the backgate effect is small are desired.

After being completed as semiconductor circuit elements, FETs and HEMTs to date have been measured for backgate-effect characteristics to judge their acceptability as semiconductor elements.

Nevertheless, inasmuch as backgate-effect characteristics of semiconductor circuit elements such as FETs and HEMTs are determined after they are fabricated up until the product final stage, in those instances in which the backgate characteristics are unacceptable the time and effort required in fabricating the FETs and HEMTs will be wasted, and moreover, a great number of defective products will end up being produced.

SUMMARY OF INVENTION

An object of the present invention, which came about in order to resolve the issues noted above, is through a method and device for determining backgate characteristics to enable preventing the fabrication of semiconductor circuit elements in which the backgate characteristics are defective.

The present inventors, making a concerted study in order to resolve the foregoing issues, brought to light the fact that when the C-V characteristics of a wafer are to be sought, by applying a separate voltage to the reverse face of the wafer and comparing with the situation in which voltage is not applied to the reverse face, a change in capacitance is evident. They discovered furthermore that this change in wafer capacitance correlates with the backgate characteristics of semiconductor components such as FETs and HEMTs. The present invention came about on the basis of this correlation.

A backgate-characteristics determination method under the present invention is characterized by including a step of finding a first C-V characteristic indicating a relation between voltage applied to the obverse face of a wafer that is to be a semiconductor circuit-element substrate, and capacitance of the wafer; a step of finding a wafer second C-V characteristic while applying a voltage to the reverse face of the wafer; and a step of determining backgate-effect characteristics for the semiconductor circuit elements by comparing the first C-V characteristic and the second C-V characteristic of the wafer.

Initially, the value of the voltage applied to the wafer obverse face is varied, and the first C-V characteristic is found by measuring capacitance at each of the applied voltage values. Next, while applying a given voltage to the reverse side of the wafer, the value of the voltage that is applied to the wafer obverse face is varied likewise as is the case with the first C-V characteristic, and a second C-V characteristic is found by measuring the capacitance at each of the applied voltage values. Then the backgate characteristics of semiconductor circuit elements fabricated with that wafer as a base are determined by comparing the first and the second C-V characteristics based on the above-mentioned correlation. In this way finding the C-V characteristics of the wafer prior to fabricating the semiconductor circuit elements enables predicting the acceptability of backgate characteristics of semiconductor components such as FETs and HEMTs fabricated utilizing the wafer.

In the present invention, by representing the abovementioned first C-V characteristic as a first C-V curve and representing the abovementioned second CV characteristic as a second C-V curve, the backgate-effect characteristics are preferably determined based on a voltage-shift amount between the first and second C-V curves. Representing the C-V characteristics as C-V curves enables determination of the backgate characteristics to be made visually.

It is further preferable that the abovementioned voltage-shift amount be made the difference between a voltage value that the first C-V curve represents for a predetermined capacitance value, and a voltage value that the second C-V curve represents for that capacitance value, and that the backgate characteristics be determined based on such voltage-shift amount. The fact that in finding the second C-V characteristic a given voltage-shift amount can accordingly be found merely by seeking that voltage value at which the capacitance is a predetermined value enables the backgate characteristics to be readily determined.

Further preferable is determining that the backgate-effect characteristics are unacceptable when the above-noted voltage-shift amount is a predetermined value or more, and that the backgate-effect characteristics are acceptable when it is less than the predetermined value. Establishing a predetermined value for voltage-shift amount based on empirical data makes the determination standard clear, thereby making for enhanced reliability of the determination.

It is preferable in the present invention to form on the wafer obverse face at least two Schottky electrodes that differ in surface area and, applying a voltage between such Schottky electrodes, find the abovementioned first and second C-V characteristic. Schottky electrodes can be obtained simply by contacting a metal on the obverse face of the wafer, which is a semiconductor, to lend them form, and electrodes therefore may be readily formed on the wafer obverse face.

It may be had, furthermore, that a Schottky electrode and an ohmic electrode are formed on the wafer obverse surface, and voltage is applied between the Schottky electrode and the ohmic electrode. Inasmuch as having the one of the electrodes be an ohmic electrode lessens the series resistance, more accurate measurements may be made.

The foregoing Schottky electrodes preferably are formed by a metal masking process in which a metal sheet, through which a hole is bored only in a portion that forms the abovementioned Schottky electrode, is contacted onto the obverse face of the wafer and metal is vapor-deposited thereon. The Schottky electrodes thus can readily be formed.

The foregoing Schottky electrodes are preferably formed by a photolithographic process. Vapor-depositing metal by transferring/developing a pattern formed in a photomask (pattern master plate) onto the wafer using an exposure device makes it possible to form the electrodes with high precision in their pattern.

Further preferable is utilizing as the foregoing Schottky electrodes an electrolyte capable of etching the wafer. C-V characteristics sought in a layer in the wafer interior can be thereby be found.

Utilizing a liquid metal as the foregoing Schottky electrode is also preferable. Voltage can be readily applied to the wafer surface in this case because the electrode can be formed just by contacting the liquid metal on the obverse face of the wafer.

It is preferable that a metal layer be formed on the reverse face of the abovementioned wafer by vapor deposition, and that the abovementioned second C-V characteristic be found by bringing a voltage-applying terminal of a power source into contact with such metal layer. The resultant superficial condition of the voltage-applying terminal makes it possible to control the contact resistance against fluctuating, which makes it possible to apply voltage accurately to the entirety of the wafer reverse face.

The above-noted second C-V characteristic preferably is found by directly contacting the voltage-applying terminal of the power source against the reverse face of the abovementioned wafer. Because in this case there is no need to form an electrode on the reverse face, voltage can readily be applied to the reverse face of the wafer.

It is further preferable that the abovementioned wafer be made of GaAs and that an alloy containing Au and Ge as base materials be vapor-deposited onto the reverse face of such wafer. Voltage can thereby be readily applied to the reverse face of the wafer by contacting the voltage-applying terminal on such alloy.

A backgate-characteristics determination device under the present invention is characterized in being equipped with a first power source for applying voltage to the obverse face of a wafer that is to be a semiconductor circuit-element substrate, a C-V gauge for measuring C-V characteristics representing a relation between voltage applied by the first power source and capacitance of the wafer, and a second power source for applying voltage to the reverse face of the wafer; and in that such C-V gauge measures a first C-V characteristic of the wafer in a state in which voltage is not applied by the second power source, and a second C-V characteristic of the wafer in a state in which voltage is applied by the second power source.

Initially, the value of the voltage applied to the wafer obverse face by the first power source is varied, and the first C-V characteristic is found by measuring capacitance using the C-V gauge at each of the applied voltage values. Next, while applying a given voltage using the second power source to the reverse side of the wafer, the value of the voltage that is applied to the wafer obverse face using the first power source is varied likewise as is the case with the first C-V characteristic, and a second C-V characteristic is found by measuring the capacitance using the C-V gauge at each of the applied voltage values. Then the acceptability of backgate characteristics of working devices fabricated with that wafer as a base are determined by comparing the first and the second C-V characteristics based on the abovementioned correlation. In this way finding the C-V characteristics of the wafer prior to fabricating the semiconductor circuit elements enables predicting the acceptability of backgate characteristics of semiconductor components such as FETs and HEMTs fabricated utilizing the wafer.

The foregoing backgate-characteristics determination device preferably is equipped with a display unit that displays a first C-V curve representing the first C-V characteristic and a second C-V curve representing the second C-V characteristic. Accordingly, acceptability of the backgate characteristics can be made by sight.

The foregoing backgate-characteristics determination device preferably is also equipped with a determination unit that determines, based on the first and the second C-V characteristics, the backgate characteristics of semiconductor circuit elements fabricated from the wafer. This allows determining the acceptability of the backgate characteristics without need for further personnel.

The foregoing determination unit preferably determines the backgate-effect characteristics based on a voltage-shift amount found by comparing a first C-V curve representing the first C-V characteristic and a second C-V curve representing the second C-V characteristic.

The abovementioned voltage-shift amount preferably is the difference between a voltage value that the first C-V curve represents for a predetermined capacitance value, and a voltage value that the second C-V curve represents for that capacitance value. The fact that in finding the second C-V characteristic a given voltage-shift amount can accordingly be found merely by seeking that voltage value at which the capacitance is a predetermined value enables the backgate characteristics to be readily determined.

Determining that the backgate-effect characteristics are unacceptable when the above-noted voltage-shift amount is a predetermined value or more, and that the backgate-effect characteristics are acceptable when it is less than the predetermined value, is preferable. Establishing a predetermined value for voltage-shift amount based on empirical data makes the determination standard clear, thereby making for enhanced reliability of the determination.

It preferable that for the above-noted first electrode, an electrolyte capable of etching the wafer be utilized as at least one voltage-applying terminal. C-V characteristics sought in a semiconductor layer in the wafer interior can be thereby be measured.

DETAILED DESCRIPTION

Below, with reference to the accompanying drawings, preferred embodiments of a backgate-characteristics determination method and a backgate-characteristics determination device having to do with the present invention will be explained in detail. Here, being that identical reference marks are utilized on identical elements, explanation that would be redundant is omitted.

Figure 1:
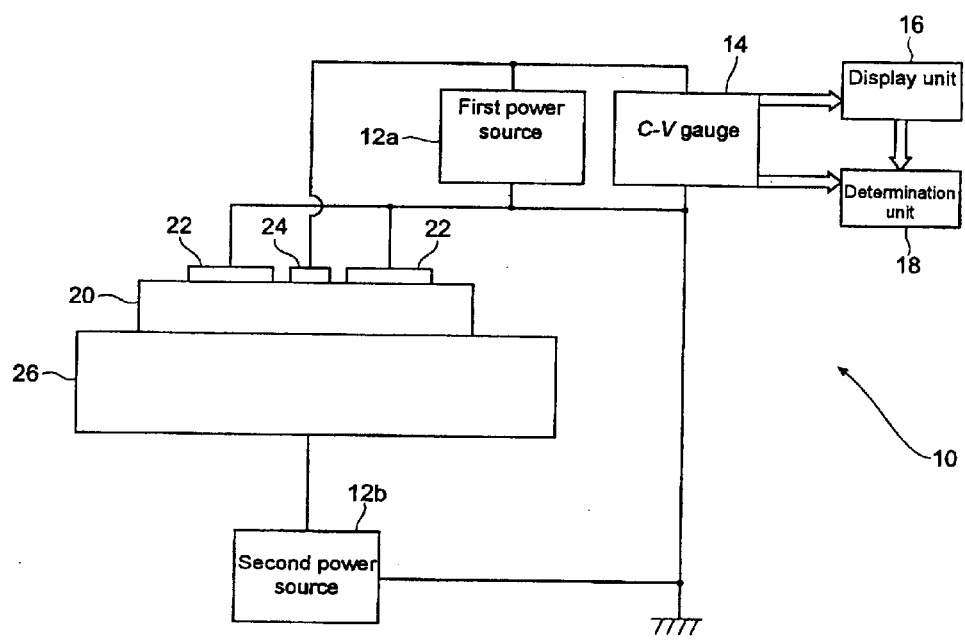
FIG. 1 is a diagram representing a backgate-characteristics determination device of the present invention in one embodiment.

First, the configuration of a device for determining backgate characteristics will be described using FIG. 1. A backgate-characteristics determination device 10 in the present embodiment is a device that based on C-V characteristics of a wafer 20 that serves as a substrate for semiconductor circuit elements determines the backgate characteristics of the semiconductor elements that are fabricated with the wafer 20 as a base. The backgate-characteristics determination device 10 is equipped with: a first power source 12a that applies a voltage to the obverse face of the wafer 20; a second power source 12b that applies a voltage to the reverse face of the wafer 20; a C-V gauge 14 that measures C-V characteristics representing the relation between the applied voltage from the first power source 12a and the capacitance of the wafer 20; a prober stage 26 on which the wafer 20 is set; a display unit 16 that displays as a C-V curve the C-V characteristics measured by the C-V gauge; and a determination unit 18 that determines acceptability of backgate characteristics based on the C-V characteristics measured by the C-V gauge 14 or else on the C-V curve displayed on the display unit 16. Herein the "obverse face" of the wafer 20 means the face of the uppermost of the semiconductor layers epitaxially deposited onto the semiconductor substrate; likewise, the "reverse face" of the wafer 20 means the bottom face of the aforementioned semiconductor substrate.

A voltage-applying terminal on the first power source 12a is connected to a Schottky electrode 22 and a Schottky electrode 24 that differ in surface area, formed on the obverse face of the wafer 20 on the prober stage 26. Schottky electrodes are utilized because being that the wafer 20 is a semiconductor, Schottky electrodes may be readily formed by contacting a metal onto its surface. The Schottky electrodes 22 and 24 may be readily formed by a metal masking process in which, with a metal sheet having an opening corresponding to the form of a Schottky electrode having been contacted onto the wafer 20 obverse face, metal is vapor-deposited thereon. The electrodes may also be formed by a precision-pattern photolithographic process in which metal is vapor-deposited by transferring/developing a pattern formed in a photomask onto the wafer 20 using an exposure device. In addition, Schottky electrodes can also be formed readily by adhering a liquid metal such as, e.g., mercury onto the wafer 20 obverse face using vacuum adsorption.

The C-V gauge 14 is connected in so as to enable measuring C-V characteristics of the wafer 20 when voltage has been applied between the Schottky electrode 22 and the Schottky electrode 24 by the first power source 12a. One of the voltage-applying terminals on the second power source 12b, moreover, is connected to the reverse face of the prober stage 26, while the other voltage-applying terminal is grounded. It will be appreciated that the former voltage-applying terminal may connected so that without the prober stage 26 intervening the voltage-applying terminal directly contacts the wafer 20 reverse face. Measurements can thereby be conducted in shorter time, although error in the measurements will be somewhat larger. The display unit 16 is input-receivably connected to the C-V gauge 14, while the determination unit 18 is input-receivably connected to the C-V gauge 14 and the display unit 16.

It should be understood that the Schottky electrode 22 may be made an ohmic electrode also. Inasmuch as making the one of the electrodes an ohmic electrode lessens the series resistance, more accurate measurements may be conducted. The Schottky electrode 24 and ohmic electrode may be formed by the foregoing precision-pattern photolithographic process.

The wafer 20 is an FET epitaxial wafer in which a semiconductor layer whose base material is at least one of GaAs, AlGaAs, or InGaAs is deposited epitaxially onto a GaAs substrate. FETs are fabricated on a wafer 20 of this sort by carrying out a predetermined process. It will be appreciated that the wafer 20 may be an HEMT epitaxial wafer made out of the same material as the aforementioned FET epitaxial wafer. In this case HEMTs are fabricated on a wafer 20 of this sort by carrying out a predetermined process.

The wafer 20 may be an FET wafer in which an ion-implanted semiconductor layer is fabricated into a GaAs substrate. Likewise, the wafer 20 may be an FET epitaxial wafer or an HEMT epitaxial wafer in which a semiconductor layer whose base material is at least one of InP, InGaAs, or 1 nAlAs, is deposited epitaxially onto an InP substrate.

The wafer 20 may be a test epitaxial wafer having an epitaxial layer whose base material is at least one of GaAs, AlGaAs, or InGaAs deposited epitaxially onto a GaAs substrate, and in which a portion of the FET or HEMT structure is omitted. Likewise, the wafer 20 may be a test epitaxial wafer having an epitaxial layer whose base material is at least one of InP, InGaAs, or InAlAs deposited epitaxially onto an InP substrate, and in which a portion of the FET or HEMT structure is omitted.

Figure 4:
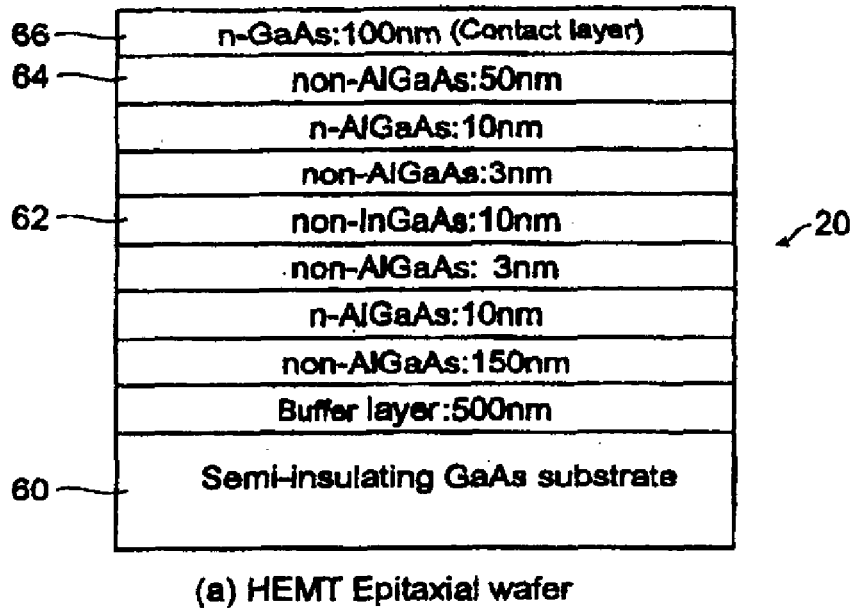
FIG. 4A is a diagram representing the structure of an HEMT epitaxial wafer, and 4B is a diagram representing the structure of an HEMT-test epitaxial wafer.
Figure 4:
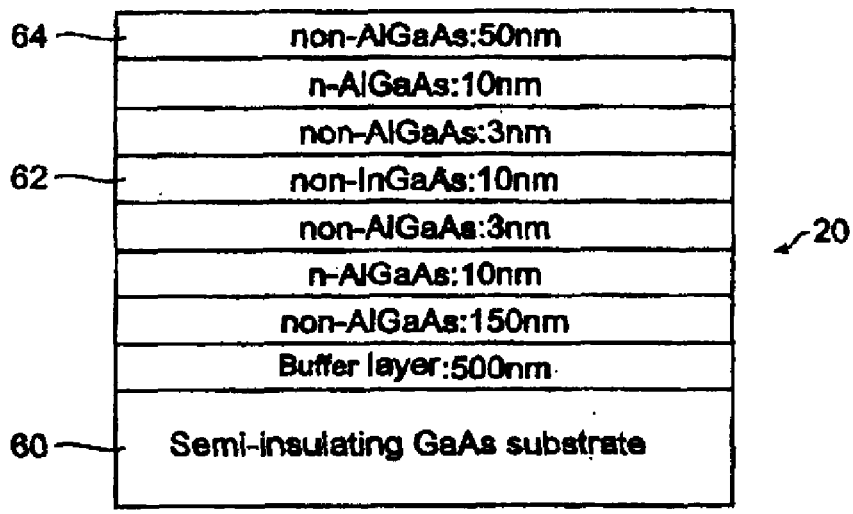

At this point, an HEMT epitaxial wafer and a test epitaxial wafer will be explained using FIGS. 4A and 4B. FIG. 4A represents an example of the structure of an HEMT epitaxial wafer, while FIG. 4B represents an example of the structure of an HEMT-test epitaxial wafer in which a portion of the HEMT structure has been omitted. That which is "non-" in the figures means that it is non-doped.

The HEMT epitaxial wafer represented in FIG. 4A is epitaxially grown from a semi-insulating substrate 60 up through an uppermost-layer contact layer 66. The non-InGaAs layer 62 is a channel layer. The fact that the drain current is varied by varying the channel width according to the gate voltage is likewise as with FETs. What differs from FETs is that it is not that the channel layer itself possesses dopants to impart carriers, but that the channel layer does not possess dopants, and carriers are obtained through the other adjoining layers. Then, by measuring the C-V characteristics of an HEMT epitaxial wafer of this sort, the acceptability of the backgate characteristics of an HMET obtained from the wafer can be predicted.

The HEMT-test epitaxial wafer represented in FIG. 4B is for testing characteristics in inner layers of the HEMT epitaxial wafer; and, without being epitaxially grown up through the contact layer 66 it is epitaxially grown up through, for example, the non-AlGaAs layer 64, which is the layer below the contact layer 66. The carrier concentration and mobility in the active layers (non-InGaAs, n-AlGaAs) between the non-InGaAs layer 62 and the non-AlGaAs layer 64 can accordingly be measured.

Next, a method for determining the acceptability of backgate characteristics of working devices such as FETs and HEMTs, fabricated with the wafer 20 as a base, will be explained according to FIG. 1. Initially a voltage is applied between the Schottky electrodes 22 and 24 by the first power source 12*a*. The value of the voltage that is applied by the power source 12*a* to the wafer 20 is varied, and a first C-V characteristic is found by measuring each of the applied voltage values, and the capacitance at each of the applied voltage values, with the C-V gauge 14. Next, while applying a −200 V voltage by means of the second power source 12*b* to the reverse side of the wafer 20 via the prober stage 26, the value of the voltage that is applied by the power source 12*a* to the wafer 20 obverse face is varied likewise as is the case with the first C-V characteristic, and a second C-V characteristic is found by measuring each of the applied voltage values, and the capacitance at each of the applied voltage values, with the C-V gauge 14. The first C-V characteristic and second C-V characteristic are displayed on the display unit 16 respectively as a first C-V curve 30*a* and a second C-V curve 30*b*; furthermore, the acceptability of the backgate characteristics is judged in the determination unit 18 based on the first C-V characteristic and the second C-V characteristic.

Figure 2:
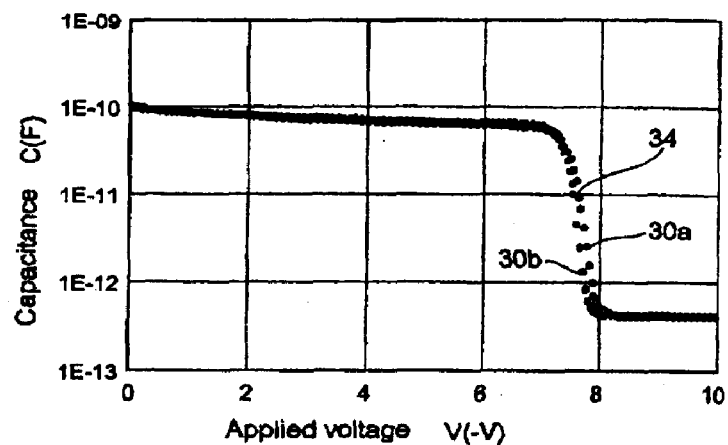
FIGS. 2A and 2B are charts plotting examples of first and second curves for a wafer.
Figure 2:
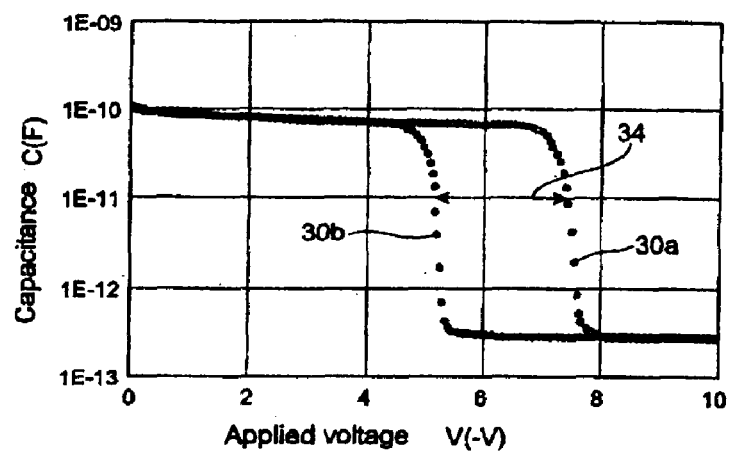

Examples of wafer 20 C-V curves displayed on the display unit 16 are depicted in FIGS. 2A and 2B. The vertical axis in the graphs is capacitance value; the horizontal axis is applied-voltage value. Finding the first C-V curve 30*a* and a second C-V curve 30*b* made apparent the following facts regarding the second CV curve 30*b*, which was measured with a −200 V voltage being applied to the wafer 20 reverse face. Confirmed was that with a certain wafer, the second C-V curve 30*b* as in FIG. 2A is approximately coincident with the first C-V curve 30*a*; likewise, with a certain wafer, the second C-V curve 30*b* as in FIG. 2B shifts sideways relative to the first C-V curve 30*a*.

That being the case, the present inventors, utilizing a number of wafers having the same C-V characteristics as with FIGS. 2A and 2B, fabricated respective FETs and HEMTs and measured the backgate characteristics. Correlations derived as a result were that the backgate characteristics of FETs and HEMTs fabricated from wafers having C-V characteristics likewise as with FIG. 2A are satisfactory, and that the backgate characteristics of FETs and HEMTs fabricated from wafers having C-V characteristics likewise as with FIG. 2B are inadequate.

It can be determined from the foregoing that in terms of the C-V characteristics of a wafer, if the second C-V curve 30*b* is as shown in FIG. 2A not shifted—or the shift amount is slight—sideways relative to the first C-V curve 30*a*, then the backgate characteristics of working devices fabricated from that wafer are satisfactory; on the other hand, if the second C-V curve 30*b* is as shown in FIG. 2B is shifted sideways relative to the first C-V curve 30*a*, then the backgate characteristics of working devices fabricated from that wafer are unsatisfactory.

In the present embodiment, data on C-V characteristics is transmitted from the C-V gage 14 to the determination unit 18, and the acceptability of the backgate characteristics is determined in the determination unit 18 based on the amount 34 by which the voltage has shifted. The voltage-shift amount 34 is found from the difference between the voltage value of the first C-V characteristic at $1 \times 10^{-11}$ F capacitance, and the voltage value of the second C-V characteristic at the same capacitance value. The fact that in finding the second C-V characteristic a given voltage-shift amount can accordingly be found merely by seeking that voltage value at which the capacitance is $1 \times 10^{-11}$ F enables the backgate characteristics to be readily determined. The determination unit 18 determines that the backgate characteristics are acceptable when the voltage-shift amount 34 is less than a predetermined value, and that the backgate characteristics are unacceptable when it is the predetermined value or more. Herein the backgate characteristics may be determined to be acceptable when the voltage-shift amount 34 is a predetermined value or less, and to be unacceptable when the voltage-shift amount 34 exceeds the predetermined value. The predetermined value for the voltage-shift amount 34 may be, to name an example, 0.5 V. Establishing the predetermined value for voltage-shift amount 34 based on empirical data makes the determination standard clear and therefore enhances the reliability of the determination. It should be understood that the predetermined value for the voltage-shift amount 34 is an appropriate value made to correspond to the measurement method and conditions, to the material properties and size of the wafer 20 that is measured, and to the voltage conditions during working-component use as well.

Likewise, inasmuch as the first and second C-V curves 30*a* and 30*b* are displayed on the display unit 16, based on these two displayed C-V curves an operator can determine the acceptability of backgate characteristics.

According to the backgate-characteristics determination method and the backgate-characteristics determination device 10 under the present embodiment, carrying out the determination noted above on the wafer 20 prior to fabricating the semiconductor components enables predicting the acceptability of backgate characteristics of working devices such as FETs and HEMTs fabricated utilizing the wafer 20.

Accordingly, not using a wafer 20 as a base material for working devices if the wafer 20 proves from the abovementioned determination to be unacceptable can prevent a large number of defective components from being produced. Furthermore, in situations in which the manufacture of the wafers 20 and the manufacture of the components are implemented at separate businesses, because the wafer 20 manufacturing company can predict the acceptability of the backgate characteristics of working devices manufactured from a fabricated wafer 20, it can supply the component-manufacturing company with wafers 20 of satisfactory quality. The fact that thus circumstances in which serious problems in guaranteeing product quality arise can be avoided enables smooth transactions to be conducted.

It should be understood that with its sole object being to determine the acceptability of backgate characteristics the present embodiment is not particularly meant for finding new C-V characteristics. To date, C-V measurement has been carried out on wafers in order to find carrier concentration and pinch-off voltage. Accordingly, in arranging for a suitable device that applies a voltage to the reverse face of wafers, the present embodiment has simplicity and convenience in that a C-V measurement sweep need be carried out just one extra time.

A modified example of the present embodiment will be explained with reference to FIG. 3. The present example is characterized in that one of the voltage-applying terminals on the first power source 12a is an electrolyte terminal 50. The electrolyte terminal 50 is composed of an electrolyte chamber 44 that holds an electrolyte, and of an electrically conductive element 38 in order that voltage be applied to the electrolyte 40 by the first power source 12a. The electrolyte chamber 44 has an incident light window 46 through which light 42 is irradiated on the electrolyte 40, and a protruding round-cylindrical terminal portion 48 in order that the electrolyte 40 be brought into contact with the wafer 20.

Voltage is applied to the electrolyte 40 via the conductive element 38 by the first power source 12a, and the C-V characteristics are measured according to the C-V gauge 14. When electrical current flows in the electrolyte 40 the obverse face of the wafer 20 is electrochemically etched by the electrolyte 40 that in the terminal portion 48 is in contact with the wafer 20. By adjusting the size of the current that flows in the electrolyte 40 the amount by which the wafer 20 is etched can be controlled, whereby the C-V characteristics sought for a wafer-internal semiconductor layer can be measured. It will be appreciated that the wafer 20 is composed of an n-type semiconductor layer and a p-type semiconductor layer, and wherein the p-type semiconductor layer is in contact with the electrolyte 40, inasmuch as current flows from the electrolyte 40 to the p-type semiconductor layer, the p-type semiconductor layer will be etched. On the other hand, wherein the n-type semiconductor layer is in contact with the electrolyte 40, inasmuch as current does not flow from the electrolyte 40 to the n-type semiconductor layer, the n-type semiconductor layer will not be etched. In this case, irradiating light 42 from the incident light window 46 on the electrolyte 40 induces optical-electromotive force within the electrolyte 40, and makes it so that current is forcedly flowed from the electrolyte 40 to the n-type semiconductor layer. The fact that the n-type semiconductor layer is accordingly etched allows C-V characteristics sought for a semiconductor layer inside a wafer to be found.

In this modified example of the present embodiment it is possible to form onto the wafer 20 an electrode that is structured the same as the electrolyte terminal 50, and thereby to utilize such electrode as a Schottky electrode. This means that application by the first power source 12a of a voltage to the conductive element 38, which would be a portion of such electrode, would apply voltage to the wafer 20 obverse face, in that it is a Schottky electrode.

Figure 3:
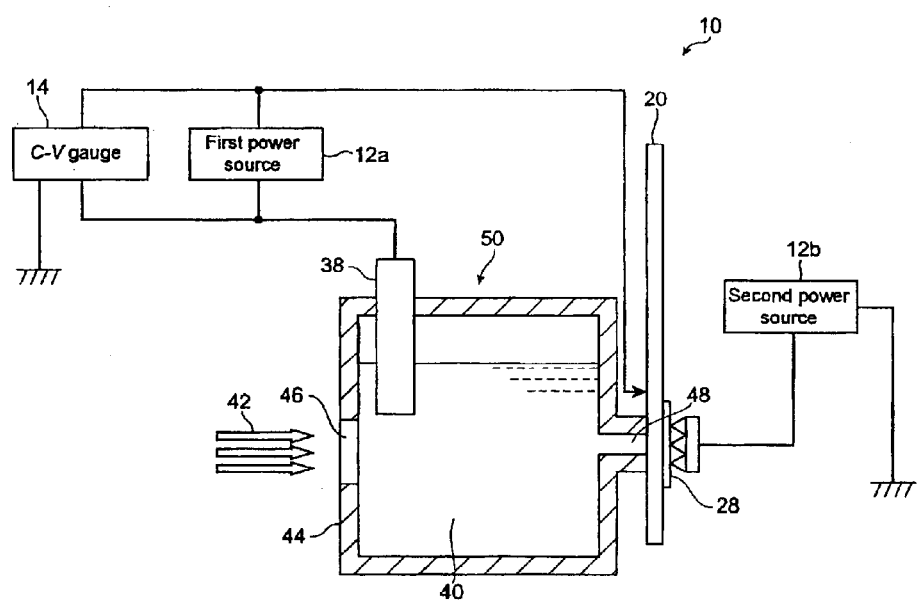
FIG. 3 is a diagram representing a modified example backgate-characteristics determination device of the present invention.

Furthermore, forming a metal layer 28 as indicated in FIG. 3 on the aforementioned wafer 20 reverse face by vapor-deposition lets the abovementioned second C-V characteristic be found by bringing the voltage-applying terminal on the second power source 12b into contact with the metal layer 28. The resultant superficial condition of the voltage-applying terminal makes it possible to control the contact resistance against fluctuating, which allows voltage to be accurately applied to the entirety of the wafer reverse face.

Such a metal layer 28 can be formed by vapor-depositing an alloy containing Au and Ge as base materials onto the reverse face of a wafer 20 made of GaAs and heat-treating it to within a range of 350° C. or more, 450° C. or less. The heating process herein is carried out at 350° C. or more because the base materials do not become alloyed if the heating temperature is lower than 350° C., since the Au and Ge do not fuse; likewise, the heating process is carried out at 450° C. or less because the surface of the vapor-deposited metal ends up becoming rough if the temperature is higher than 450° C.

Although the present invention has been specifically explained above based on an embodiment, the present invention is not thereby limited. For example, although the foregoing embodiment has it that the backgate-characteristics determination device 10 is equipped with two power sources, it may be equipped with a single power unit that can respectively accomplish functions identical with these first and second power sources.

Moreover, although the voltage-shift amount 34 is found from the difference between the voltage value of the first C-V characteristic at a predetermined capacitance value, and the voltage value of the second C-V characteristic at the same capacitance value, it may be found by deriving respectively from the first C-V characteristic and the second C-V characteristic relations between capacitance value per unit electrode surface area, and voltage value, finding respective voltage values at a predetermined capacitance per unit electrode surface area, and taking the difference between these voltage values. The voltage-shift amount 34 furthermore may be found by deriving respectively from the first C-V characteristic and the second C-V characteristic relations between carrier concentration and voltage value, finding respective voltage values at a predetermined carrier concentration, and taking the difference between these voltage values. Inasmuch as the relation between capacitance value per unit electrode surface area, and voltage value, and the relation between carrier concentration and voltage value, are correlative with the C-V characteristics, in determining the backgate characteristics the relations can be treated equally as with the C-V characteristics.

Furthermore, although in the present embodiment the second C-V curve 30*b* is found after finding the first C-V curve 30*a*, the first C-V curve 30*a* may be found after finding the second C-V curve 30*b*.

Likewise, in determining the backgate characteristics based on the voltage-shift amount 34, having it that the voltage-shift amount 34 is found by seeking the voltage value for which the capacitance will be $1\times10^{-11}$ F respectively for the first C-V characteristic and the second C-V characteristic eliminates the need to find the C-V characteristics in detail, whereby the acceptability of the backgate characteristics can be readily determined.

In terms of the present invention, by seeking out characteristics of a wafer, the acceptability of its backgate characteristics for semiconductor circuit elements such as FETs and HEMTs can be determined.

What is claimed is:

1. A backgate-characteristics determination method for determining backgate-effect characteristics for semiconductor circuit elements, the backgate-characteristics determination method comprising:

a step of finding a first C-V characteristic indicating a relation between voltage obverse-facially applied to, and capacitance of, a wafer that is to be a semiconductor circuit-element substrate;

a step of finding a second C-V characteristic of said wafer while reverse-facially applying a voltage to said wafer; and a step of determining backgate-effect characteristics for the semiconductor circuit elements by comparing the first C-V characteristic and the second CV characteristic of said wafer.

2. The backgate-characteristics determination method set forth in claim 1, wherein:

the first C-V characteristic is represented as a first C-V curve, and the second C-V characteristic is represented as a second C-V curve; and the backgate-effect characteristics are determined based on a voltage-shift amount between the first C-V curve and the second C-V curve.

3. The backgate-characteristics determination method set forth in claim 2, wherein said voltage-shift amount is the difference between a voltage value that the first C-V curve represents for a predetermined capacitance value, and a voltage value that the second C-V curve represents for said capacitance value.

4. The backgate-characteristics determination method set forth in claim 2, wherein the backgate-effect characteristics are determined to be unacceptable when said voltage-shift amount is a predetermined value or more, and are determined to be acceptable when said voltage-shift amount is less than the predetermined value.

5. The backgate-characteristics determination method set forth in claim 1, at least two Schottky electrodes that differ in surface area being formed on the obverse face of said wafer; wherein the first C-V characteristic and the second C-V characteristic are found by applying a voltage between the Schottky electrodes.

6. The backgate-characteristics determination method set forth in claim 1, a Schottky electrode and an ohmic electrode being formed on the obverse face of said wafer; wherein the first C-V characteristic and the second C-V characteristic are found by applying a voltage between the Schottky electrode and the ohmic electrode.

7. The backgate-characteristics determination method set forth in claim 5, wherein the Schottky electrodes are formed by a metal masking process in which, with a metal sheet having an opening corresponding in contour to the Schottky electrode being contacted onto the obverse face of said wafer, metal is vapor-deposited thereon.

8. The backgate-characteristics determination method set forth in claim 6 wherein the Schottky electrode is formed by a metal masking process in which, with a metal sheet having an opening corresponding in contour to the Schottky electrode being contacted onto the obverse face of said wafer, metal is vapor-deposited thereon.

9. The backgate-characteristics determination method set forth in claim 5, wherein the Schottky electrodes are formed by a photolithographic process.

10. The backgate-characteristics determination method set forth in claim 6, wherein the Schottky electrode and the ohmic electrode are formed by a photolithographic process.

11. The backgate-characteristics determination method set forth in claim 5, wherein an electrolyte capable of etching said wafer is utilized as the Schottky electrodes.

12. The backgate-characteristics determination method set forth in claim 6, wherein an electrolyte capable of etching said wafer is utilized as the Schottky electrode.

13. The backgate-characteristics determination method set forth in claim 5, wherein a liquid metal is utilized as the Schottky electrodes.

14. The backgate-characteristics determination method set forth in claim 6, wherein a liquid metal is utilized as the Schottky electrode.

15. The backgate-characteristics determination method set forth in claim 1, wherein said wafer is a wafer having a substrate made of GaAs, and an ion-implanted semiconductor layer.

16. The backgate-characteristics determination method set forth in claim 1, wherein said wafer is an FET epitaxial wafer, or an HEMT epitaxial wafer, having a substrate made of GaAs, and an epitaxial layer formed, with at least one of GaAs, AlGaAs, or InGaAs being a base material, onto the substrate.

17. The backgate-characteristics determination method set forth in claim 1, wherein said wafer is a test epitaxial wafer of a construction having a substrate made of GaAs, and an epitaxial layer formed, with at least one of GaAs, AlGaAs, or InGaAs being a base material, onto the substrate, and in which a portion of its structure for FETs or HEMTs is omitted.

18. The backgate-characteristics determination method set forth in claim 1, wherein said wafer is an FET epitaxial wafer, or an HEMT epitaxial wafer, having a substrate made of InP, and an epitaxial layer formed, with at least one of InP, InGaAs, or InAlAs being a base material, onto the substrate.

19. The backgate-characteristics determination method set forth in claim 1, wherein said wafer is a test epitaxial wafer of a construction having a substrate made of InP, and an epitaxial layer formed, with at least one of InP, InGaAs, or InAlAs being a base material, onto the substrate, and in which a portion of its structure for FETs or HEMTs is omitted.

20. The backgate-characteristics determination method set forth in claim 17, wherein omitted from said test epitaxial wafer is only a contact layer in its structure for FETs or HEMTs.

21. The backgate-characteristics determination method set forth in claim 19, wherein omitted from said-test epitaxial wafer is only a contact layer in its structure for FETs or HEMTs.

22. The backgate-characteristics determination method set forth in claim 1, wherein:

a metal layer is formed on the reverse face of said wafer by vapor deposition; and the second C-V characteristic is found by bringing a voltage-applying terminal of a power source into contact with said metal layer.

23. The backgate-characteristics determination method set forth in claim 1, wherein the second C-V characteristic is found by bringing a voltage-applying terminal of a power source into direct contact with the reverse face of said wafer.

24. The backgate-characteristics determination method set forth in claim 1, wherein:

said wafer is made of GaAs; and an alloy containing Au and Ge as base materials is vapor-deposited onto the reverse face.

25. A backgate-characteristics determination device for determining backgate-effect characteristics for semiconductor circuit elements, the backgate-characteristics determination device comprising:

a first power source for applying voltage obverse-facially to a wafer that is to be a semiconductor circuit-element substrate;

a C-V gauge for measuring C-V characteristics representing a relation between voltage applied by the first power source and capacitance of said wafer; and a second power source for applying voltage reverse-facially to said wafer; wherein the C-V gauge measures a first C-V characteristic of said wafer in a state in which voltage is not applied by the second power source, and a second C-V characteristic of said wafer in a state in which voltage is applied by the second power source.

26. The backgate-characteristics determination device set forth in claim 25, further comprising a display unit for displaying a first C-V curve representing the first C-V characteristic and a second C-V curve representing the second C-V characteristic.

27. The backgate-characteristics determination device set forth in claim 25, further comprising a determination unit that determines, based on the first C-V characteristic and the second C-V characteristic, the backgate characteristics of semiconductor circuit elements fabricated from said wafer.

28. The backgate-characteristics determination device set forth in claim 27, wherein said determination unit determines the backgate-effect characteristics based on a voltage-shift amount found by comparing a first C-V curve representing the first C-V characteristic and a second C-V curve representing the second C-V characteristic.

29. The backgate-characteristics determination device set forth in claim 28, wherein said voltage-shift amount is the difference between a voltage value that the first C-V curve represents for a predetermined capacitance value, and a voltage value that the second C-V curve represents for said capacitance value.

30. The backgate-characteristics determination device set forth in claim 28, wherein said determination unit determines that the backgate-effect characteristics are unacceptable when said voltage-shift amount is a predetermined value or more, and that the backgate-effect characteristics are acceptable when said voltage-shift amount is less than the predetermined value.

31. The backgate-characteristics determination device set forth in claim 25, wherein for said first electrode, an electrolyte capable of etching said wafer is utilized as at least one voltage-applying terminal.

* * * * *